(12) United States Patent
Kawano et al.

(10) Patent No.: US 6,541,784 B1
(45) Date of Patent: Apr. 1, 2003

(54) ELECTRON BEAM EXPOSURE SYSTEM AND EXPOSING METHOD USING AN ELECTRON BEAM

(75) Inventors: Hajime Kawano, Hitachinaka (JP); Haruo Yoda, Nishitama-gun (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/567,001

(22) Filed: May 9, 2000

(30) Foreign Application Priority Data

May 11, 1999 (JP) ............................................. 11-129576

(51) Int. Cl.$^7$ ........................... H01J 37/244; G03F 9/00
(52) U.S. Cl. ................. 250/492.3; 250/492.3; 250/492.22; 250/492.23; 250/398; 250/398 R; 250/307
(58) Field of Search .......................... 250/692.3, 692.2, 250/692.22, 692.23, 398, 398 R, 396 R, 307

Primary Examiner—Bruce Anderson
Assistant Examiner—Zia R. Hashmi
(74) Attorney, Agent, or Firm—Kenyon & Kenyon

(57) ABSTRACT

It is an object of the present invention to provide an electron beam drawing apparatus and a drawing method using an electron beam capable of reducing a correction error of proximity effect correction without adding a special circuit or a memory and capable of preventing thinning or thickening of a pattern arranged at a vicinity of an edge of a pattern having a high density from being caused.

In order to resolve the above-described object, an embodiment according to the present invention is provided with a constitution constituted by the steps of dividing a specimen into virtual meshes having a predetermined dimension, calculating an area density of a drawing pattern for each mesh, calculating an area density map of a total of a drawing region and storing the area density map in a memory, calculating a modified area density by executing a correction for the area density in consideration of back-scattering energy and forward-scattering energy in a resist of the specimen caused by the electron beam, calculating a modified area density map of the total of the drawing region and storing the modified area density map in the memory, and repeating these steps to thereby determine an exposure dose.

13 Claims, 9 Drawing Sheets

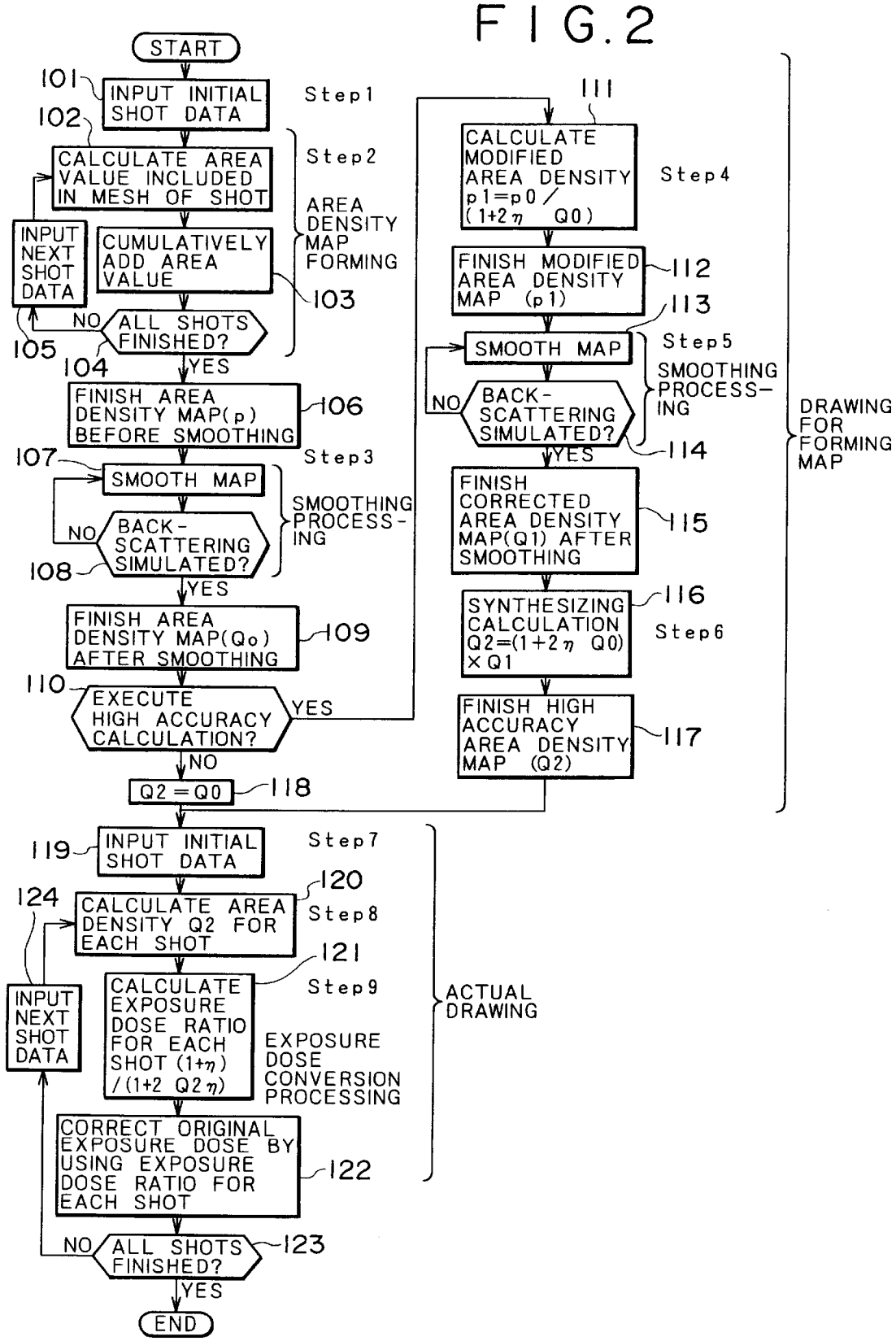

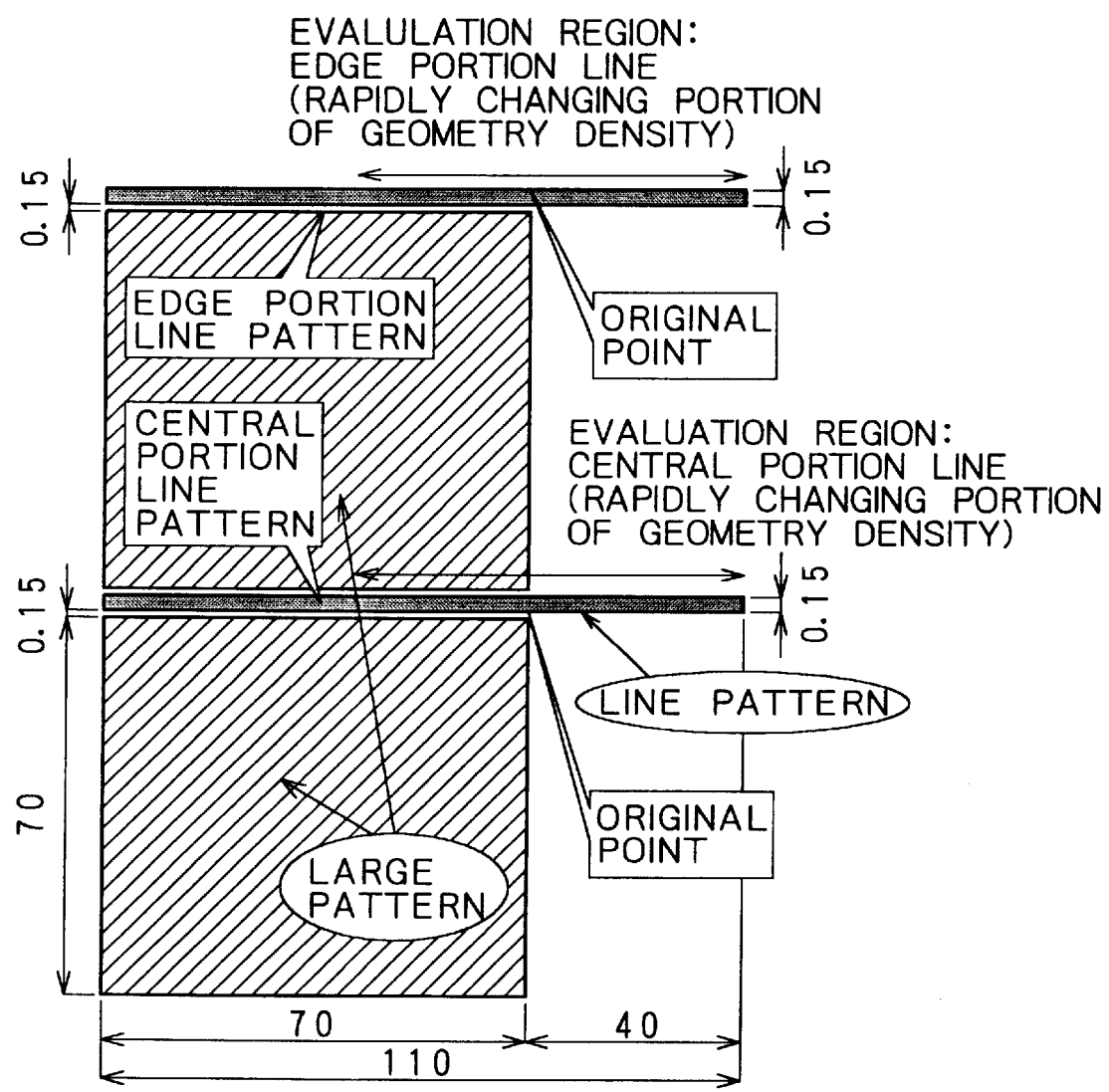

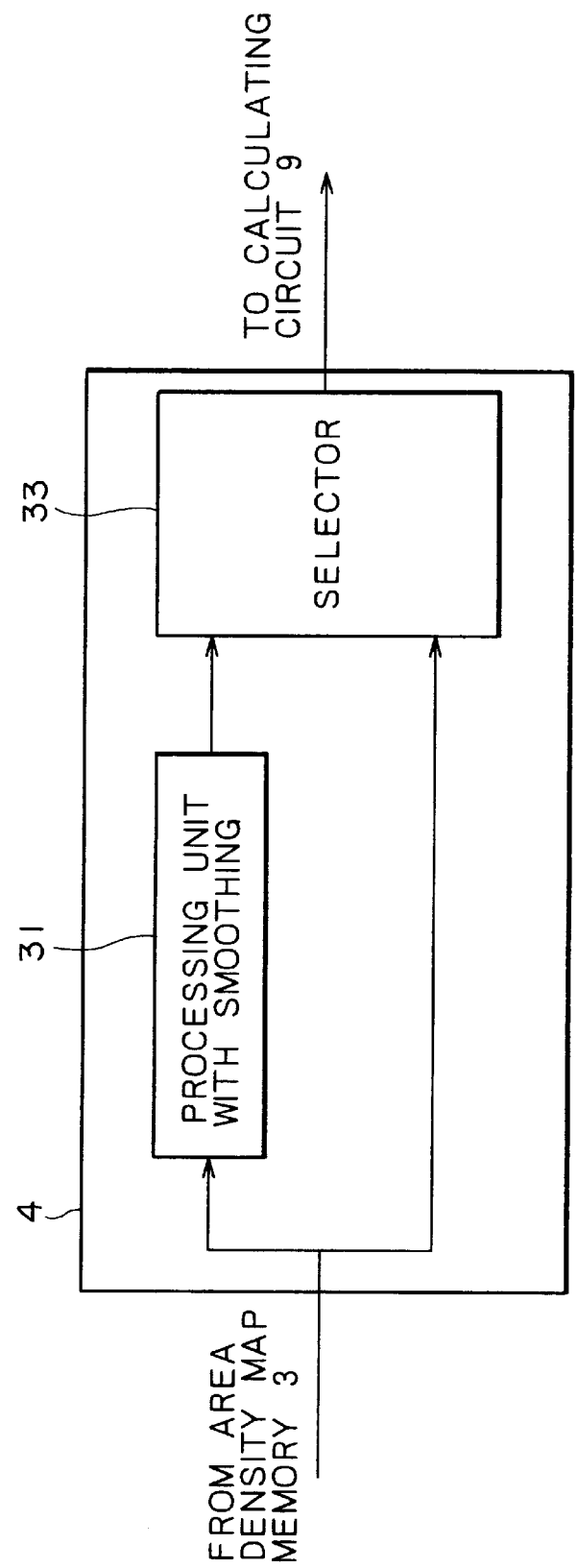

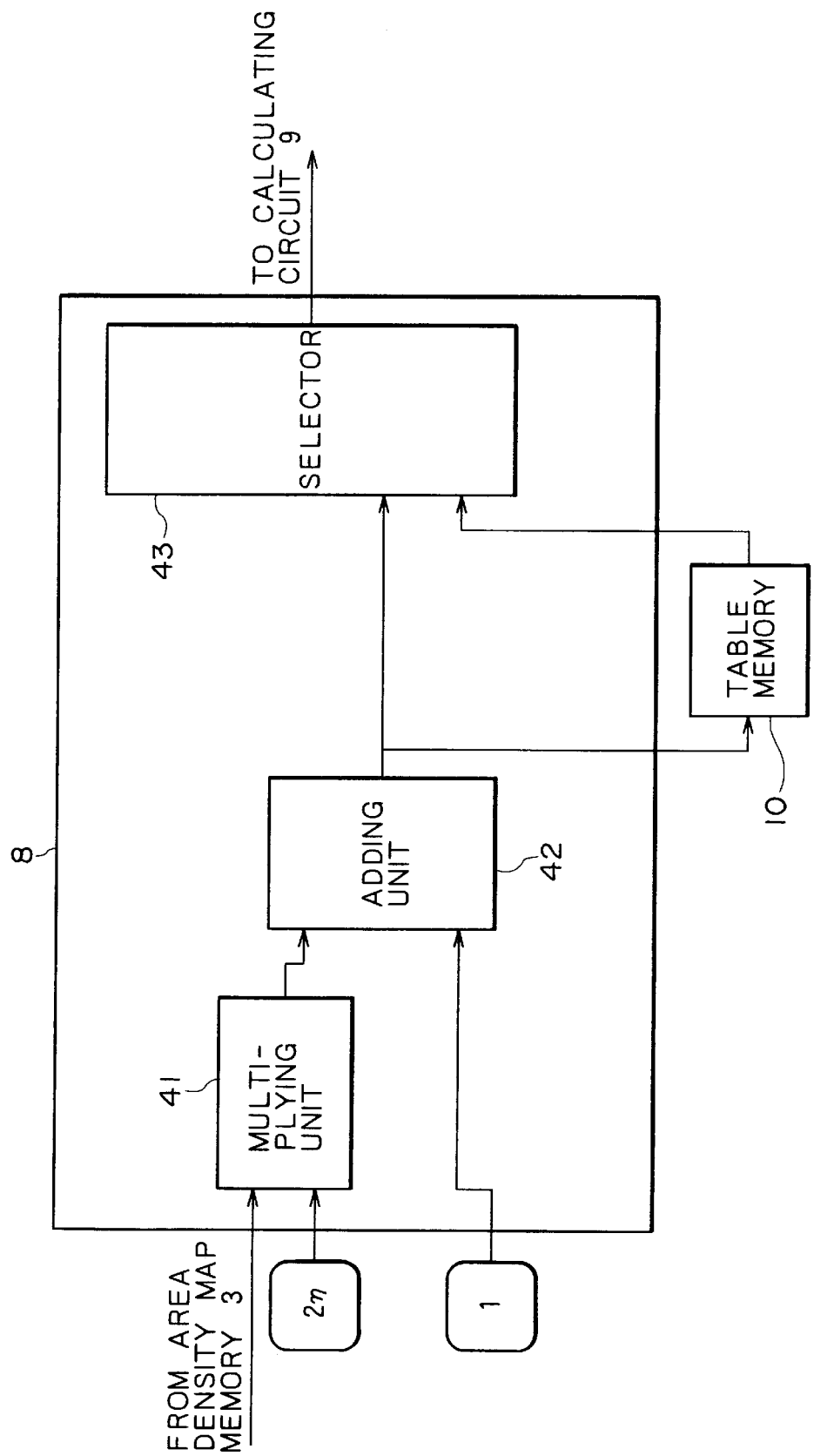

ELECTRON BEAM EXPOSURE SYSTEM AND EXPOSING METHOD USING AN ELECTRON BEAM

FIELD OF THE INVENTION

The present invention relates to an electron beam drawing apparatus for drawing a circuit pattern or the like on a semiconductor wafer by using an electron beam and a drawing method using an electron beam.

BACKGROUND OF THE INVENTION

An electron beam drawing apparatus has a great task for improvement in accuracy. Taking several examples, process conditions, proximity effect, blur of an electron beam (error caused by Coulomb effect, an electron beam deflector), accuracy of a mechanism system (positioning accuracy in moving a wafer and a mask) or the like influences on the accuracy.

Among the above-described, the proximity effect is an error caused by whether a drawing pattern is dense or sparse. For example, this is a phenomenon in which in the case of an isolated pattern having a wide interval between patterns with respect to a total of a region of a wafer for drawing, a line width thereof is slender and in the case of a pattern referred to as an overall pattern having a wide area, that is, having a high density with respect to a total of a region, thickening is produced. In recent years, resolution of the above-described problem becomes important owing to a necessity of miniaturization of a line width referred to as design rule for a pattern drawn on a wafer.

As a resolution of a problem in which a pattern is drawn differently from a design value in this way, there is provided an exposure dose determining method for executing proximity effect correction by using an area density map or an exposure dose map disclosed in a literature, F. Murai et al, "Fast proximity effect correction method using a pattern area density map", J. Vac. Sci. Technol. B 10(6) November/December 1992, pp. 3072–3076, Japanese Patent Laid-Open No. 03-225816, Japanese Patent Laid-Open No. 08-213315, Japanese Patent Laid-Open No. 10-229047, U.S. Pat. Nos. 5,149,975 and 5,278,421.

This is a method in which a mesh in a rectangular shape having a certain size is assumed, an area density of a pattern is calculated for each mesh, a map representing a change in the area density of a total of a drawing region is referred to as an area density map or an exposure dose map, and an exposure dose is determined in accordance with the size of the area density to thereby draw the pattern. For example, in the case of the above-described isolated pattern, the area density is small and therefore, the exposure dose is increased whereas in the case of a pattern having a high area density, the exposure dose is reduced.

Further, according to the method, drawing operations of virtual drawing for forming the area density map and actual drawing are carried out. According to the virtual drawing, a calculation is executed up to deflection control of an electron beam with no irradiation on a wafer with the electron beam. Thereby, the area density map is formed and an actual exposure dose is calculated based on data of the area density map to execute actual drawing.

An explanation will be given of the above-described conventional method in reference to FIG. 5 and FIG. 6. FIG. 5 is a functional block diagram representing a constitution of proximity effect correction according to the prior art and FIG. 6 is a flowchart showing its procedure and the explanation will be given as follows.

(1) Drawing for Forming an Area Density Map (a) Start of Proximity Effect Correction Function In FIG. 5, there exists data for each shot (a pattern diagram which an actual electron beam can draw by one time exposure) subjected to diagram decomposition (decomposition of pattern data into the pattern which the actual electron beam can draw) at a preceding stage (not illustrated) in an input unit 1 and the following processing is executed for each shot.

(b) Step 1: Start (Input of Data)

Initial shot data is inputted to the input unit 1 in FIG. 5 (block 201 in FIG. 6) and is transmitted to an area density map forming unit 2.

(c) Step 2: Forming an Area Density Map

In the area density map forming unit 2, an area value of a region included in mesh of shot is calculated (block 202 in FIG. 6) and is cumulatively added to an area value of the same mesh (block 203 in FIG. 6). When there is next shot (block 204 in FIG. 6), the next shot is further inputted (block 205 in FIG. 6). The area value of the mesh is previously determined and accordingly, a ratio thereof to the area value of the shot is defined as an area density per mesh. Similar processing is executed for the next shot, the area density per mesh $p(x)$ is calculated, an area density of a total of a drawing reason is mapped and processings of all the shots are finished (block 204 in FIG. 6) and an area density map of the area density $p(x)$ is finished in an area density map memory 3 (block 206 in FIG. 6).

(d) Step 3: Smoothing Processing

Next, the area density map $p(x)$ stored in the area density map memory 3 is read and smoothing is executed for the read map by using a smoothing unit 4 (block 207 in FIG. 6). In this case, the reason of executing smoothing is as follows. Originally, the role of the proximity effect correction resides in executing a correction by simulating back-scattering in which an electron beam is spread in a resist of a wafer by shot and the smoothing unit is a unit for simulating the back-scattering.

Generally, as shown by the above-described literature, the back-scattering can be approximated by a Gaussian distribution and accordingly, the simulation can be carried out by adding a filter such as a Gaussian filter.

After the above-described smoothing operation, the smoothed data is stored again in the area density map memory 3. This operation is repeatedly executed, simulation of the back-scattering is finished (block 208 in FIG. 6) and an area density map constituted by data of the smoothed area density $Q0(x)$ is finished.

(2) Actual Drawing

An exposure dose is calculated based on the area density map of the area density $Q0(x)$ finished in the above-described processing.

(a) Step 4: Start of Actual Drawing (Reading of Data)

Similarly to (1) drawing for forming an area density map, data of the same initial drawing pattern is inputted from the input unit 1 (block 210 in FIG. 6) and is transmitted to the area density map forming unit 2.

(b) Step 5: Area Density Calculation for Each Shot

In the area density map forming unit 2, an address in the area density map memory 3 is calculated, and a value of the area density $Q0(x)$ for each shot is calculated from the area density map memory 3 based on the address (block 211 in FIG. 6).

(c) Step 6: Exposure Dose Conversion Processing

Next, an exposure dose ratio $[(1+\eta)/\{1+2\eta Q0(x)\}]$ for each shot which is a coefficient in consideration of both of forward-scattering energy and back-scattering energy is calculated based on the area density Q0(x) smoothed by simulating the back-scattering (block 212 in FIG. 6). Here, notation η designates a reflection coefficient representing a ratio of the back-scattering energy to the forward-scattering energy. The reflection coefficient η is varied by influence of resist or process and accordingly, the reflection coefficient η must be determined for a material of forming a pattern of a wafer and individual steps.

By using the exposure dose ratio, an exposure dose I(x) for each shot is given by the following equation (1)

$$I(x)=I_{50\%}(x)\cdot(1+\eta)/\{1+2\eta Q0(x)\} \quad (1)$$

where $I_{50\%}(x)$ is an optimum exposure dose with respect to a pattern of 50%.

Further, a value of the calculated exposure dose I(x) is transmitted to an output unit 7 via an exposure amount converting unit 5 and calculation 6 (block 213 in FIG. 6).

When there is next shot (block 214 in FIG. 6), the next shot is further inputted (block 215 in FIG. 6), Step 4 through Step 6 are repeatedly executed and the proximity effect correction is finished by finishing all the shots (block 214 in FIG. 6).

According to the conventional method explained above, an error of a pattern drawn in several $\mu$m becomes about several tens nm and the accuracy is sufficient in the case in which the error permitted to the pattern formed on a wafer is about 10%, and poses no problem. However, progress of miniaturization of a circuit pattern of a semiconductor device is fast, in recent years, there are a number of patterns of 0.3 $\mu$m or smaller and therefore, the error of about several tens nm becomes problematic. That is, in the case of a pattern of 0.3 $\mu$m, the error needs to restrain to 30 nm or smaller and in the case of the pattern of 0.1 $\mu$m, the error needs to restrain to about 10 nm.

However, according to the above-described correction method of the prior art using Equation (1), at a portion of the pattern where the pattern density is abruptly changed, the error is caused, and thinning or thickening is produced in a pattern arranged at a vicinity of an edge of a pattern having a high density. The amount of thinning or thickening falls in a range of several nm through several tens nm and will bring about a serious problem in the miniaturization in the future.

As a cause of the above-mentioned problem, it is conceivable that in the above-described prior art the proximity effect correction is constituted by using the approximation (1) derived on the promise that the pattern density is hardly changed in a range of a back-scattering diameter (a magnitude of scattering of an electron beam in a resist of a wafer).

SUMMARY OF THE INVENTION

It is an object of the present invention to provide an electron beam drawing apparatus and a drawing method using electron beam capable of reducing a correction error of proximity effect correction without adding a special circuit or a memory and capable of preventing thinning or thickening of a pattern arranged at a vicinity of an edge of a pattern having a high density from being caused.

In order to resolve the above-described object, according to an embodiment of the present invention, correction represented by Equation (1), described above, is reconsidered from a theoretical view point, a method of approximating at a higher order, back-scattering energy and forward-scattering energy is adopted in consideration of a change in a pattern density in a range of a back-scattering diameter and there is adopted a novel proximity effect correcting method adopting a method of determining an exposure dose by modifying an area density thereby.

That is, an embodiment according to the present invention is constructed by a constitution including the steps of dividing the specimen into virtual meshes having a predetermined dimension; calculating an area density of a drawing pattern for each virtual mesh; calculating an area density map of a total of a drawing region of the specimen and storing the area density map in a memory; calculating a modified area density by executing a correction for the area density in consideration of a back-scattering energy and a forward-scattering energy in a resist of the specimen caused by the electron beam to calculate a modified area density; calculating a modified area density map of the total of the drawing region and storing the modified area density map in the memory; and repeating the steps at least twice to determine an exposure dose on the specimen.

Further, another embodiment according to the present invention is constructed by a constitution including the steps of predicting a dimensional deformation caused due to a back-scattering energy and a forward-scattering energy in a resist of a specimen caused by irradiating the drawing pattern to be drawn on the specimen with the electron beam; forming an exposure dose map by calculating an exposure dose of the electron beam used for correcting the dimensional deformation with respect to a total of a drawing region of the specimen; and executing drawing based on the exposure dose map.

Further, still another embodiment according to the present invention is constructed by a constitution including the steps of dividing the specimen into virtual meshes having a predetermined dimension; calculating an area density of the drawing pattern for each virtual mesh; calculating a correction amount of the area density in consideration of a back-scattering energy and a forward-scattering energy in a resist of the specimen caused by the electron beam using a higher order approximation; and determining an exposure dose of the drawing pattern.

Further, further embodiment according to the present invention is constructed by a constitution including the steps of dividing the specimen into virtual meshes having a predetermined dimension; calculating an area density of the drawing pattern for each virtual mesh to form an area density map of a total of a drawing region of the specimen; calculating a first corrected area density by executing a smoothing correction for the area density in consideration of a back-scattering energy and a forward-scattering energy in a resist of the specimen caused by the electron beam to form a first corrected area density map of the total of the drawing region; calculating a modified area density from the first corrected area density and the area density to form a modified area density map of the total of the drawing region; calculating a second corrected area density by performing a smoothing correction for the modified area density in consideration of the back-scattering energy and the forward-scattering energy in the resist of the specimen caused by the electron beam to form a second corrected area density map of the total of the drawing region; calculating an exposure area density from the second corrected area density and the first corrected area density to form an exposure area density map of the total of the drawing region; and calculating an exposure dose for exposing the drawing pattern based on the exposure area density map.

Further, still further embodiment according to the present invention is constructed by a constitution including the steps of calculating an area density of the drawing pattern used for correcting an exposure dose of the electron beam based on a difference from a desired dimension produced by irradiating the drawing pattern drawn on the specimen with the electron beam; calculating an area density map of a total of a drawing region of the specimen and storing the area density map in a memory; and when a pattern contiguous to a line pattern having a linear shape among the drawing patterns drawn on the specimen stays in the middle for its length in a longitudinal direction of the line pattern, determining an exposure dose such that a rate of a change in a width dimension of the line pattern is equal to or smaller than 4% relative to a width dimension of the line pattern at other position before and after the position based on the area density map stored to the memory for drawing.

BRIEF DESCRIPTION OF THE DRAWINGS

FIG. 2 is a flowchart showing a procedure of the function shown in FIG. 1;

FIG. 3 is a plane view showing an evaluation pattern constituting an object in simulation;

FIG. 8 is a functional block diagram showing an inner constitution of a smoothing unit; and FIG. 9 is a functional block diagram showing an inner constitution of a modified amount calculating unit.

DETAILED DESCRIPTION OF THE PREFERRED EMBODIMENTS

Figure 1:
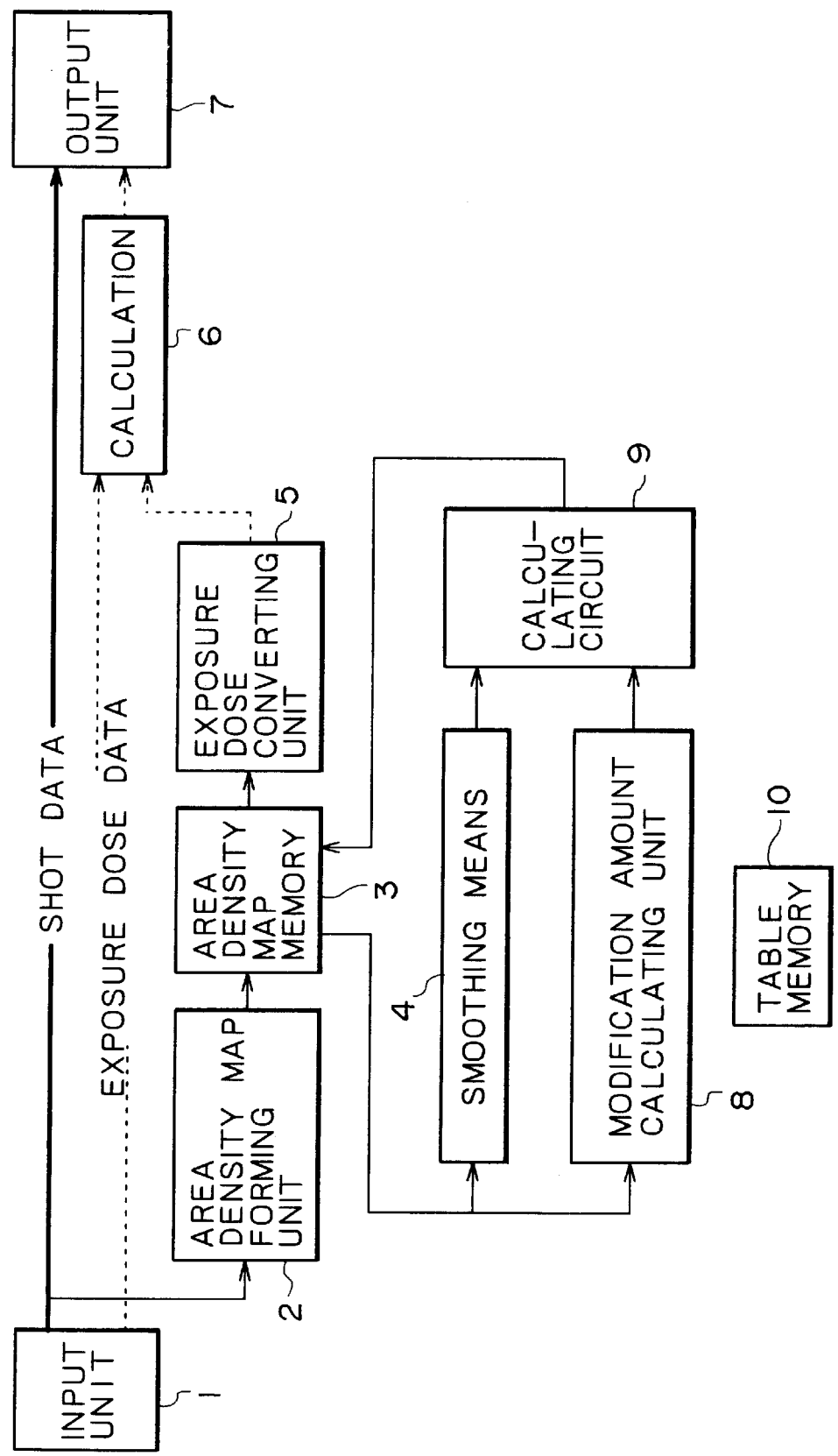
FIG. 1 is a functional block diagram showing a constitution realizing a function of proximity effect correction.

An explanation will be given of embodiments according to the invention in reference to the drawings as follows.

First, an explanation will be given of a way of thinking on modification of the above-described Equation (1).

An electron beam irradiated onto a surface of a resist of a wafer, enters a silicon substrate after giving energy to inside of a resist and electrons back-scattered in the silicon substrate reach again the inside of the resist and give energy. Energy accumulated at inside of the resist by the former is referred to as "accumulated energy by forward-scattering" and energy accumulated by the latter is referred to as "accumulated energy by back-scattering" to differentiate them from each other.

Now, back-scattering is assumed to be scattering in accordance with a Gaussian distribution spatially and a ratio of total accumulated energy by back-scattering to total accumulated energy by forward-scattering is put as the reflection coefficient η, an accumulated energy distribution E by back-scattering is given by Equation (2).

$$E = \eta \int \phi(x-x')I(x')p(x')dx' \quad (2)$$

In this equation, notation $\phi$ designates Gauss function, notation I designates accumulated energy by forward-scattering and notation p designates an area density of a pattern. Further, notation x' designates a certain position on x coordinate.

Therefore, accumulated energy of an electron beam irradiated portion and accumulated energy of an electron beam unirradiated portion are respectively calculated as follows.

irradiated portion:

$$I(x) + \eta \int \phi(x-x')I(x')p(x')dx' \quad (3)$$

unirradiated portion:

$$\eta \int \phi(x-x')I(x')p(x')dx' \quad (4)$$

Now, when there is adopted an exposure reference in which a median value of energy of the irradiated portion and energy of the unirradiated portion is set to a constant level D, an integral equation of Equation (5) is provided.

$$2D = I(x) + 2\eta \int \phi(x-x')I(x')p(x')dx' \quad (5)$$

This is the basic equation for calculating the proximity effect correction. That is, with respect to p(x) which is a function representing an area density of a pattern, accumulated energy I(x) by forward-scattering satisfying the above-described integral equation is calculated to thereby constitute an exposure amount I(x) and a pattern is drawn by an intensity of an electron beam in proportion thereto, it is anticipated that a drawing result which is not influenced by the proximity effect can be provided.

The above-described integral equation of Equation (5) is referred to as Fredholm integral equation of a second kind and is difficult to solve analytically and normally, approximate solution is provided by the successive approximation method. Hence, in this case, better approximate solution is provided by the following steps.

(1) Step 1: 0-th Order Approximate Solution $I_{[0]}(x)$ is Provided

Integral equation to be calculated:

$$2D = I(x) + 2\eta \int \phi(x-x')I(x')p(x')dx' \quad (6)$$

In Equation (6), when I(x') at an inside of integration is put to be substantially equal to I(x) and taken out of the integral symbol, Equation (7) is constituted.

$$2D = I(x) + 2\eta I(x) \int \phi(x-x')p(x')dx' \quad (7)$$

As approximate solution $I_{[0]}(x)$, Equation (8) and Equation (9) are provided.

$$I_{[0]}(x) = 2D/\{1 + 2\eta Q0(x)\} \quad (8)$$

$$Q0(x) = \int \phi(x-x')p(x')dx' \quad (9)$$

In these equations, notation Q0(x) designates an area density subjected to smoothing and correction simulating back-scattering energy.

By substituting $D = (1+\eta)I(x)/2$ for Equation (1) of proximity effect correction, described above, the Equation coincides with Equation (8). For example, when the optimum exposure dose in the case of the area density of 50% is designated by notation $I_{[0]50\%}(x)$, the form of the equation is the same as that of Equation (1) and Equation (10) is constituted.

$$I_{[0]}(x) = I_{[0]50\%}(x) \cdot (1+\eta)/\{1+2\eta Q0(x)\} \times \quad (10)$$

Further, to obtain higher approximate solution, the next step is calculated.

(2) Step 2: 1-th Order Approximate Solution $I_{[1]}(x)$ is Calculated

When a solution to be calculated is put as $I_{[1]}(x)=\alpha(x)I_{[0]}(x)$ and substituted for the original integral equation (6), Equation (11) is provided.

$$2D=\alpha(x)I_{[0]}(x)+2\eta\int\phi(x-x')\alpha(x')I_{[0]}(x')p(x')dx' \quad (11)$$

Also in this case, when $\alpha(x')$ is approximated to be substantially constant and equal to $\alpha(x)$, $\alpha$ can be taken out of the integration and Equation (12) is provided.

$$2D=\alpha(x)I_{[0]}(x)+2\eta\alpha(x)\int\phi(x-x')I_{[0]}(x')p(x')dx' \quad (12)$$

Accordingly, since $\alpha$ can be solved, as 1-th approximate solution $I_{[1]}(x)$, Equation (13), Equation (14) and Equation (15) are provided.

$$I_{[1]}(x) = \alpha(x)I_{[0]}(x) \quad (13)$$
$$= 2D \cdot I_{[0]}(x) \Big/ \Big\{ I_{[0]}(x) + 2\eta\int\phi(x-x')I_{[0]}(x')p(x')dx' \Big\}$$
$$= 2D/\{1+2\eta Q2(x)\}$$

$$Q2(x)=Q1(x)\cdot\{1+2\eta Q0(x)\} \quad (14)$$

$$Q1(x)=\int\phi(x-x')p(x')/\{1+2\eta Q0(x')\}dx' \quad (15)$$

The above-described is the basic equation of the invention. Here, notations $Q1(x)$ and $Q2(x)$ respectively represent area densities.

An explanation will be given as follows of embodiments of the invention based on the way of thinking described above.

Figure 7:
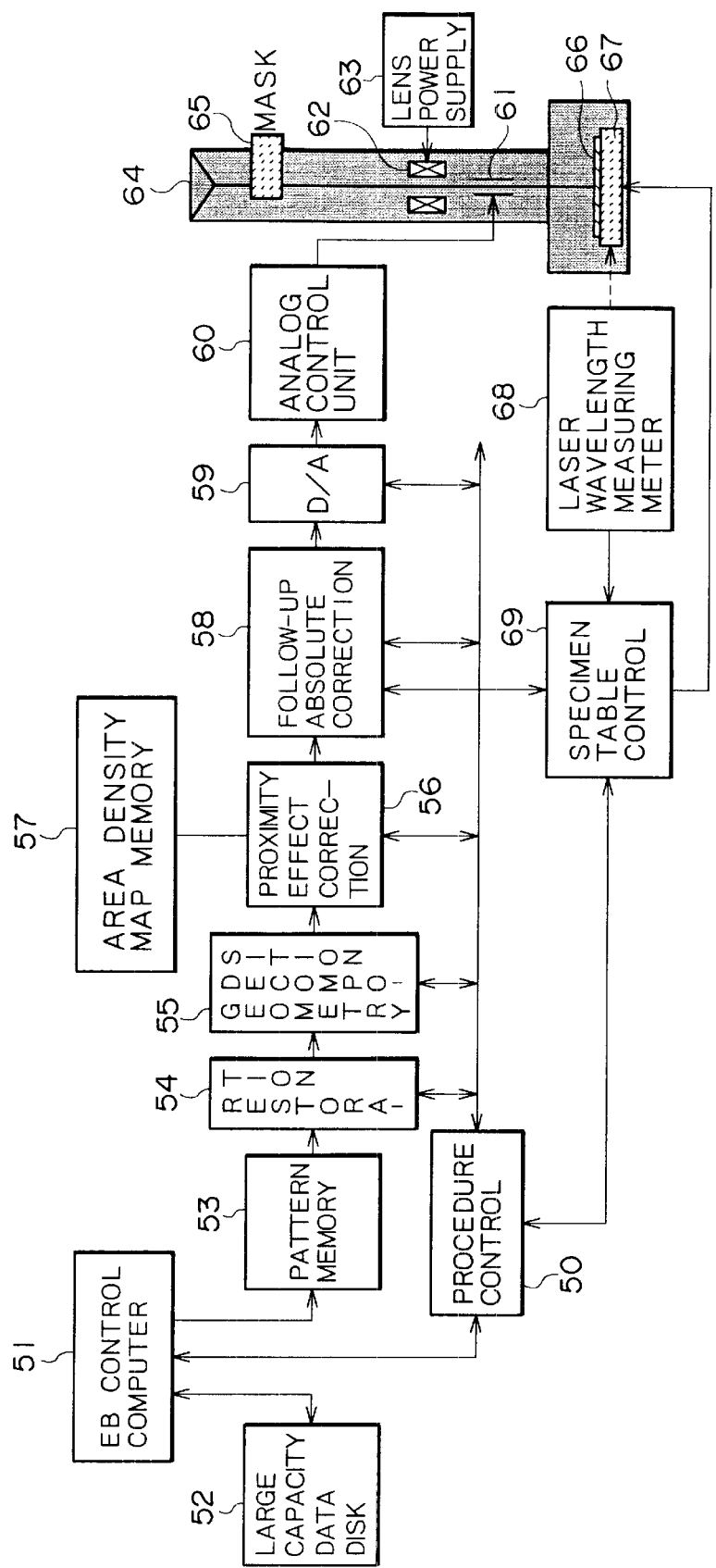
FIG. 7 is a functional block diagram showing an outline constitution of an electron beam drawing apparatus.

FIG. 7 is a functional block diagram showing an outline constitution of an electron beam drawing apparatus and an electron beam body tube portion of an apparatus shown on the right side in the drawing is represented by a vertical sectional view. In FIG. 7, a wafer 66 is held on a specimen table 67. An electron beam emitted from an electron source 64 is rectified in shape by a lens 62 in the body tube, deflected further by a deflector 61 and irradiated to a target position on the wafer 66. The sectional shape of the electron beam to be irradiated can be changed by selecting a mask 65. A lens power supply 63 is provided with a function of stably operating the lens 62.

The left side portion in FIG. 7 indicates a functional block diagram of a control system. By instruction from an EB control computer 51, pattern data for executing drawing operation stored in a large capacity data disk 52 is transmitted to a pattern memory 53. The pattern data is converted continuously (in pipe line manner) into deflection data of the electron beam and is transmitted to the deflector 61 to thereby deflect the electron beam.

An explanation will be given of the processing in an order as follows.

(1) Pattern Memory 53

Compressed pattern data transmitted from EB control computer 51 is stored.

(2) Restoration 54

The compressed pattern data is restored to a format for drawing.

(3) Geometry Decomposition 55

Individual one of geometries of the restored pattern data is replaced by a shot having a shape capable of drawing by the electron beam and respective data of a position, a shape and an exposure dose of each shot is formed.

(4) Proximity Effect Correction 56

This is a portion for executing a processing for correcting the proximity effect. An area density per unit area of a pattern to be drawn previously and an area density map of a total of a drawing region is calculated and stored to an area density map memory 57. Further, the exposure dose is corrected by a unit of shot while referring to the value and the data is transmitted to a follow-up absolute correction 58.

(5) Follow-up Absolute Correction 58

Based on information of a position of the specimen table inputted from a laser length measuring meter 68 for measuring the position of the specimen table to a specimen table control 69, a position of deflecting the electron beam is calculated such that the electron beam is irradiated to the target position of the wafer 66, the control data is transmitted to the specimen table control 69 and an amount of deflection warp of the electron beam body tube portion is also corrected. Thereby, contiguous drawing can be executed.

(6) D/A Converter 59

The data transmitted from the follow-up absolute correction 58 is D/A-converted.

(7) Procedure Control 50

The procedure control 50 executes monitoring and control such that processings of the above-described respective units function smoothly.

(8) Analog Control Unit 60

The analog control unit 60 generates a signal for controlling deflection of electron beam based on the data transmitted from the D/A converter 59 and controls the deflector.

FIG. 1 is a functional block diagram showing a constitution of realizing the function of the proximity effect correction shown in FIG. 7 and FIG. 2 is a flowchart showing the procedure. The procedure is grossly classified into [1] drawing for forming a map and [2] actual drawing.

An explanation will be given of the procedure in an order as follows.

[1] Drawing for Forming an Area Density Map (a) Start of Proximity Effect Correction Function At the input unit 1 shown in FIG. 1, there exists data for each shot (pattern geometry which can be drawn by an actual electron beam in one time exposure) subjected to geometry decomposition (decomposition of pattern data into a pattern which can be drawn by the actual electron beam) at a prestage (not illustrated) and the following processing is executed for each shot.

(b) Step 1: Start (Input of Data)

First, data of initial shot is inputted to the input unit 1 (block 101 in FIG. 2) and is transmitted to the area density map forming unit 2.

(c) Step 2: Forming an Area Density Map

In the area density map forming unit 2, an area value included in a mesh is calculated (block 102 in FIG. 2) and is cumulatively added to an area value of the same mesh (block 103 in FIG. 2).

When there exists next shot (block 104 in FIG. 4), the next shot is further inputted (block 105 in FIG. 2). A similar processing is executed for the next shot, thereafter, an area density p(x) included in a single mesh is calculated, the processing of all the shots is finished (block 104 in FIG. 2) and an area density map is finished in the area density map memory 3 (block 106 in FIG. 2).

(d) Step 3: Smoothing Processing 1

Next, similar to the conventional example, smoothing is executed to the area density p(x) at the smoothing unit 4 (block 107 in FIG. 2), and the smoothed density p(x) is stored again to the area density map memory 3. At this occasion, the smoothed area density p(x) is not overwritten to the area density map before smoothing which has been formed previously, this operation is repeatedly executed (block 108 in FIG. 2) to form an area density map of a corrected area density Q0(x) after smoothing and correction simulating the back-scattering (block 109 in FIG. 2).

Thereby, the area density p(x) is simulated by the back-scattering diameter and the corrected area density Q0(x) after smoothing and correction shown by the following equation (16) after smoothing is calculated.

$$Q0(x) = \int \phi(x-x')p(x')dx \quad (16)$$

Equation (16) is the same as the above-described equation (9) and correction by the conventional method is constituted by the above-described steps.

In the case in which calculation with higher accuracy is executed with respect to the area density map calculated in this way, Step 4 and later steps are added (block 110 in FIG. 2).

(e) Step 4: Corrected Area Density Calculation

In order to take the forward-scattering energy in consideration, the area density p(x) before smoothing in the area density map memory 3, is modified by an exposure dose of 0-th order approximation by using the reflection coefficient $\eta$ representing the ratio of the back-scattering energy to the forward-scattering energy. That is, a corrected area density p1(x) is calculated by the following equation (17).

$$p1(x) = p(x)/\{1+2\eta Q0(x)\} \quad (17)$$

This is provided by replacing an area density p(x') by the area density p1(x') in the above-described equation (16) for calculating an area density Q1(x) and substituting the area density p1(x') for Equation (15).

In this case, the area density p(x) before smoothing and the corrected area density Q0(x) after smoothing and correction having the same address on the area density map memory 3, respectively need to be read and subjected to an operational processing such as addition, multiplication or division (block 111 in FIG. 2) and the corrected area density p1(x) indicating the same address needs to be stored in the area density map memory 3 (block 112 in FIG. 2).

Hence, the following processing is executed.

(1) The area density p(x) having the same address from the area density map memory 3 is processed by the smoothing unit 4 and the corrected area density Q0(x) is processed by a modified amount calculating unit 8. In this case, smoothing is not executed and data is made through. Therefore, there is also provided a selecting function for making through at inside of the smoothing unit 4.

FIG. 8 is a functional block diagram showing an inner constitution of the smoothing unit 4. For example, as shown in FIG. 8, there are provided a processing unit with smoothing 31 and a function of through for preventing data from passing therethrough and a function selecting the through function by a selector 33 as necessary. In the above-described case, the through is selected by the selector 33.

Otherwise, in the case in which the smoothing unit 4 is a Gaussian filter, when only the central value of the filter is set to 1 and the filter is set to 0 at other position, even if the filter is added to the area density, there is no change and an effect the same as that of the through can be achieved without adding the filter to the area density.

(2) FIG. 9 is a functional block diagram showing an inner constitution of the modified amount calculating unit 8. Calculation of $(2\eta Q0(x))$ in the above-described equation (17) is processed by a multiplying unit 41 and calculation of $\{1+2\eta Q0(x)\}$ in the above-described Equation (17) is executed by an adding unit 42. However, a dividing circuit is needed in executing to calculate an inverse number of $[1/\{1+2\eta Q0(x)\}]$ by a calculating circuit, which is very complicated. Hence, data having the inverse number of $\{1+2\eta Q0(x)\}$ in Equation (17) is previously stored to a table memory 10. That is, the data is calculated by the EB control computer 51 in FIG. 7, and the data is transmitted to the table memory 10 via a communication path between the EB control computer 51 and the proximity effect correction 56 before starting the virtual drawing. When the inverse number $[1/\{1+2\eta Q0(x)\}]$ is outputted from the table memory 10, $\{1+2\eta Q0(x)\}$ constitutes an address of the table memory 10 and accordingly, a very simple circuit can be constituted without including a divider.

(3) After processing $[1/\{1+2\eta Q0(x)\}]$ in Equation (17) provided from the table memory 10 in the area density p(x) which is made through at the smoothing unit 4 and the modified amount calculating unit 8 in FIG. 1, a desired value is outputted by multiplying the data at the calculating circuit 9. However, in this case, it is necessary to process the area density p(x) and $[1/\{1+2\eta Q0(x)\}]$ in Equation (17) having the same address. As a method of processing thereof, although memories before and after processing the area density p(x) or $[1/\{1+2\eta Q0(x)\}]$ in Equation (17) may be prepared and processed alternately, it is preferable to carry out the parallel processing to dispense with waste of processing time.

Further, in the above-described Equation (17), $\eta>0$, Q0(x) $>0$ and accordingly, a value of p1(x) in the equation does not exceed a maximum value of p(x). Therefore, it is not necessary to increase the maximum value of the area density p(x). That is, in an actual apparatus constitution, a number of bits of memory is not increased and the conventional area density map memory 3 per se can be used.

Further, in storing the modified area density p1(x) in the area density map memory 3, when the modified area density p1(x) is overwritten on the area density p(x), without separately preparing a memory similar to the area density map memory 3, a capacity of the area density map memory 3 can be saved.

(f) Step 5: Smoothing 2 (Simulating the Modified Area Density by the Back-scattering)

Next, the modified area density p1(x) calculated at Step 4 in FIG. 2 is transmitted to the smoothing unit 4, smoothing operation is executed (block 113 in FIG. 2), the smoothing is repeated until simulating by the back-scattering diameter (block 114 in FIG. 2) and a smoothed corrected area density Q1(x) smoothed by the following equation (18) is calculated (block 115 in FIG. 2) by the above-described Equation (15) and Equation (17).

$$Q1(x) = \int \phi(x-x')p(x')dx' \quad (18)$$

However, when the smoothed corrected area density Q1(x) is stored in the area density map memory 3, by overwriting the smoothed corrected area density Q1(x) on the modified area density p1(x) on the area density map memory 3, without separately preparing a memory similar to the area density map memory 3, a capacity of the area density map memory 3 can be saved.

(g) Step 6: Synthesizing Calculation

By using the following equation (19) the same as the above-described equation (14), an area density Q2(x) is calculated by synthesizing the corrected area density Q0(x) after smoothing and the corrected area density Q1(x) after smoothing.

$$Q2(x) = Q1(x) \cdot \{1+2\eta Q0(x)\} \quad (19)$$

First, the corrected area density Q0(x) after smoothing and the corrected area density Q1(x) after smoothing at an address indicating the same position on the area density map memory 3 are called and a result of executing the operation processing (block 116 in FIG. 2) is again stored to the modified area density p1(x) at the address indicating the same position (block 117 in FIG. 2). Further, the following processing is executed to calculate the area density Qp2(x).

(1) The smoothed corrected area density Q1(x) having the same address from the area density map memory 3, is processed by the smoothing unit 4 in FIG. 1 and the corrected area density Q0(x) after smoothing is processed by the modified amount calculating unit 8. In this case, smoothing is not executed and data of the corrected area density Q1(x) is made through. That is, the through is selected by the selector 33 in FIG. 8.

(2) Meanwhile, data of the corrected area density Q0(x) after smoothing is transmitted to the modified amount calculating unit 8 in FIG. 1. In this case, a calculating circuit including the adding unit 42 and the multiplying unit 41 as in FIG. 9 is previously provided at inside of the modified amount calculating unit 8 such that calculation of $\{1+2\eta Q0(x)\}$ in the above-described Equation (19) is executed. As in Step 4 in FIG. 2, mentioned above, in the case of referring to the table memory 10 in FIG. 9, the selector 43 is provided at poststages of the adding unit 42 and the multiplying unit 41 such that the data can be selected at the selector 43.

(3) The area density Q2(x) is outputted by multiplying the corrected area density Q1(x) by $\{1+2\eta Q0(x)\}$ in the above-described Equation (19) by the calculating circuit 9 in FIG. 1.

However, at this occasion, it is necessary to process the corrected area density Q1(x) and $\{1+2\eta Q0(x)\}$ in Equation (19) having the same address. As a method of processing thereof, although memories before and after processing the modified area density Q1(x) or $\{1+2Q0(x)\}$ in Equation (19) may be prepared and these may be processed alternately, in order to dispense with of processing time, it is preferable to execute parallel processing. That is, basically, the processing procedure is the same as the processing procedure at Step 4 in FIG. 2, mentioned above, and accordingly, the apparatus constitution can be commonly used.

Further, although calculation of $\{1+2\eta Q0(x)\}$ in Equation (19) is executed at inside of the modified amount calculation unit 8 in FIG. 1, in this case, similar processing can be executed by preparing pluralities of adders and multipliers at inside of the calculating circuit 9.

Further, in storing the area density map of the area density Q2(x) in the area density map memory 3, when the area density map of the area density Q2(x) is overwritten on the area density map of the corrected area density Q1(x), the capacity of the area density map memory 3 can be saved.

As described above, by using Step 4 through Step 6 in FIG. 2, the theoretical first order solution can be provided. The area density Q2(x) for exposure provided here is used for calculating the exposure dose.

Further, when a second order approximation of the integral equation of the above-described Equation (5) is calculated, the nearly ideal proximity effect correction can be executed. For that purpose, calculation may be repeated similar to steps from Equation (11) to Equation (19). By repeating the steps, a desired higher order approximation can be provided, however, much time period is required and accordingly, the order number of solution may be determined from permitted dimensional accuracy and time.

Further, when the high accuracy calculation is not executed (block 110 in FIG. 2), by considering Q2=Q0 (block 118 in FIG. 2), processing at and after [2] is executed.

[2] Actual Drawing

Correction of the exposure dose is executed based on the area density map of the area density Q2(x) completed in the above-described processing.

(a) Step 7: Start of Actual Drawing (Reading of Data)

Similar to [1], initial shot data is inputted from the input unit 1 in FIG. 1 (block 119 in FIG. 2) and is transmitted to the area density map forming unit 2.

(b) Step 8: Area Density Calculation for Each Shot

In the area density map forming unit 2 in FIG. 2, an address in the area density map memory 3 is calculated and the value of the area density Q2(x) for each shot is calculated from the area density map memory 3 by the address. (block 120 in FIG. 2)

(c) Step 9: Exposure Dose Conversion Processing

Next, based on the area density Q2(x), the exposure dose ratio $[(1+\eta)/\{1+2\eta Q2(x)\}]$ (block 121 in FIG. 2). Further, the exposure dose I(x) is calculated by the following Equation (20) (block 122 in FIG. 2).

$$I(x)=I_{50\%}(x)\cdot(1+\eta)/\{1+2\eta Q2(x)\} \quad (20)$$

Equation (20) is constituted by substituting $D=(1+\eta)I_{50\%}(x)/2$ in the first order approximation equation (13). The calculated exposure dose I(x) is transmitted to the output unit 7 via the exposure dose converting unit 5 and the operation processing 6 shown in FIG. 1.

Further, whether next shot is present or not is determined (block 123 in FIG. 2), when the next shot is present, next shot data is further inputted (block 124 in FIG. 2), Step 8 through Step 9 is repeatedly executed, all the shot are determined to finish (block 123 in FIG. 2) and the proximity effect correction is finished.

Although in the above-described, a description has been given of the method of processing the operation at inside of the memory density map memory 3 such that the area density map memory 3 is not uselessly increased, it is naturally possible to execute the operation processing by two or more area density map memories.

The effect of the invention, described above, can be confirmed by using double Gaussian method described in a literature of J. M. Pavkovich, "Proximity effect correction calculations by the integral equation approximate solution method", J. Vac. Sci. Technol. B 4(1)), January/February 1986, pp.159–163 without actually executing drawing operation. FIG. 3 is a plane view showing an evaluation pattern constituting an object by simulation using the double Gaussian method. The unit of dimension is $\mu$m. The evaluation pattern is constituted by two of patterns having large areas, a central portion line pattern in a shape of a line having a width of 0.15 $\mu$m disposed at the central portion by being sandwiched by the two large patterns and an edge portion line pattern in a shape of a line having a width of 0.15 $\mu$m contiguous to a side face (edge portion) of one of the patterns having the large areas. In simulation, with respect to these line patterns, an evaluation is executed by using the double Gaussian method described in the literature. The conventional proximity effect correction uses Equation (1), mentioned above, and the proximity effect correction according to the invention uses Equation (13), Equation (14) and Equation (15), mentioned above.

FIG. 4 illustrates related diagrams showing a result of simulation of a relationship between the coordinate and the line width on the line patterns. As the coordinate, a position denoted as an original point in FIG. 3 is set to 0 and the negative side indicates a position on a side of the pattern having the large area (high density side) and the positive side indicates a position on a side opposed thereto (isolated side).

Figure 4A:
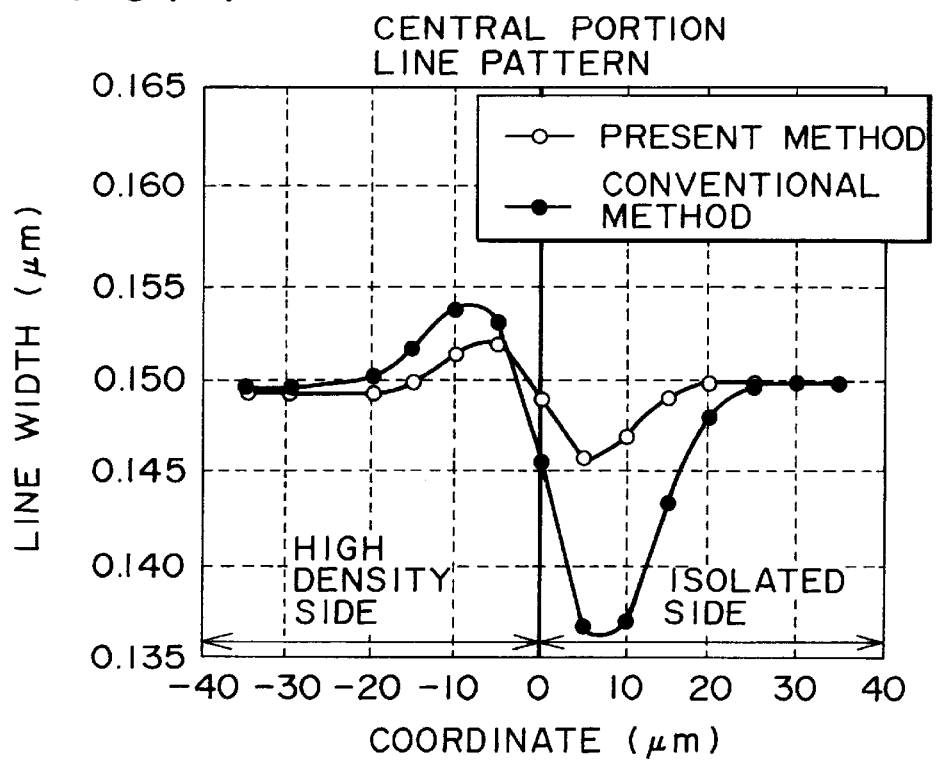
FIGS. 4A and 4B illustrate related diagrams showing a result of simulation on a relationship between coordinate and line width on a line pattern.
Figure 4B:
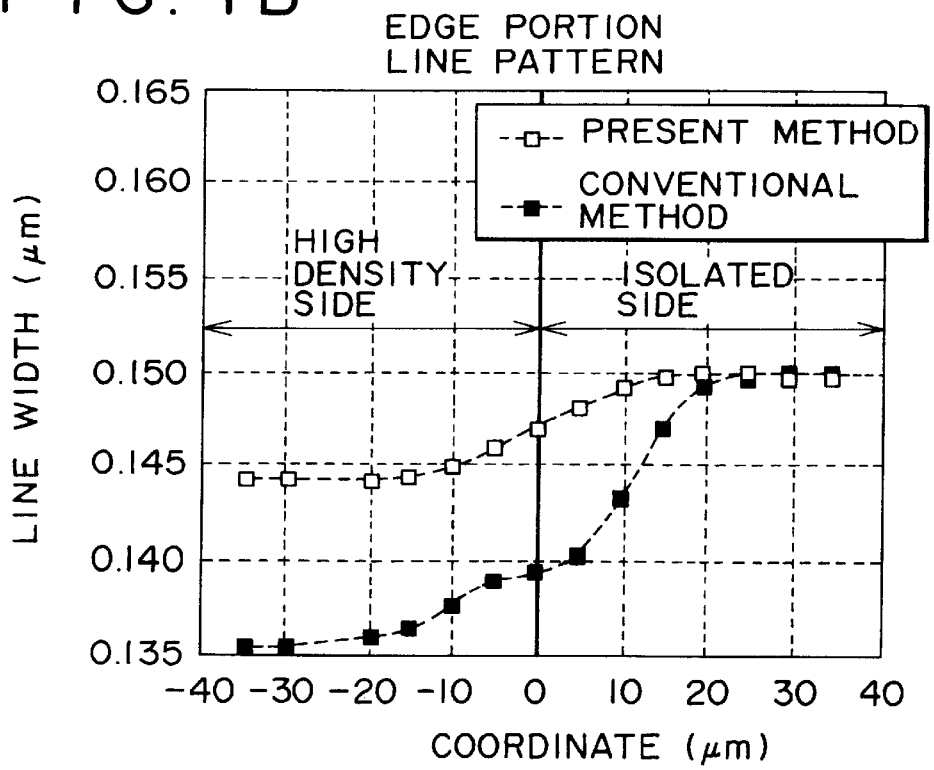
Figure 5:
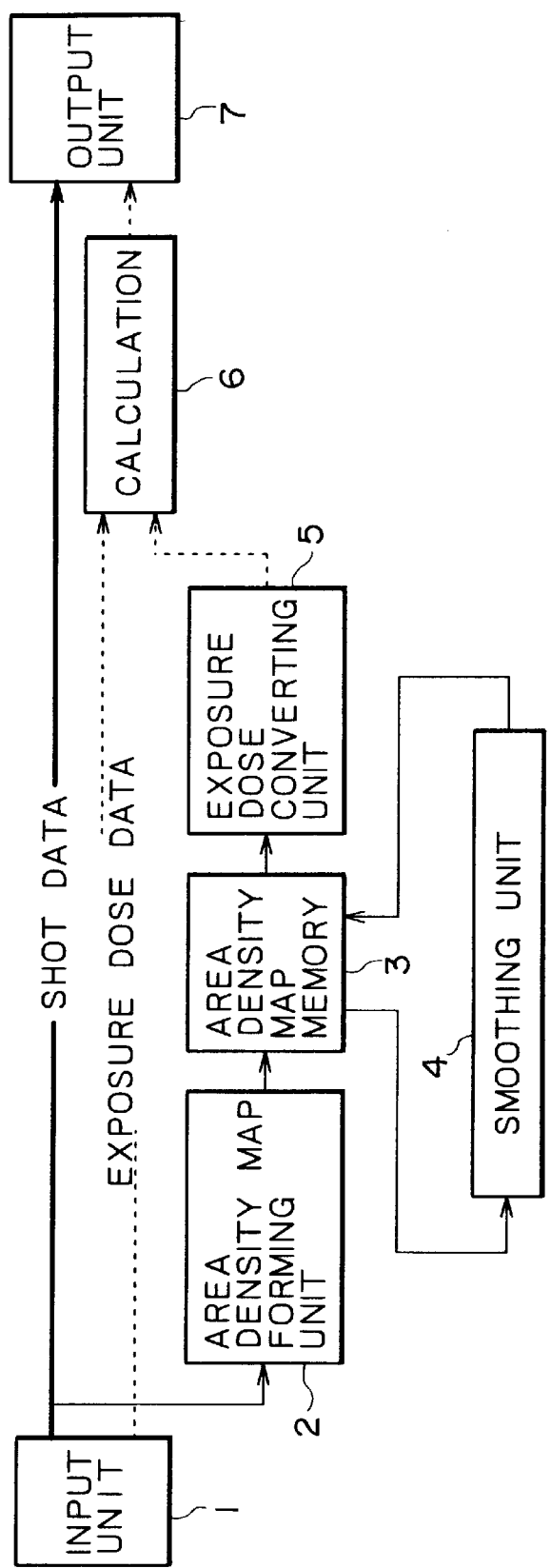
FIG. 5 is a functional block diagram showing a constitution of proximity effect correction according to a prior art.
Figure 6:
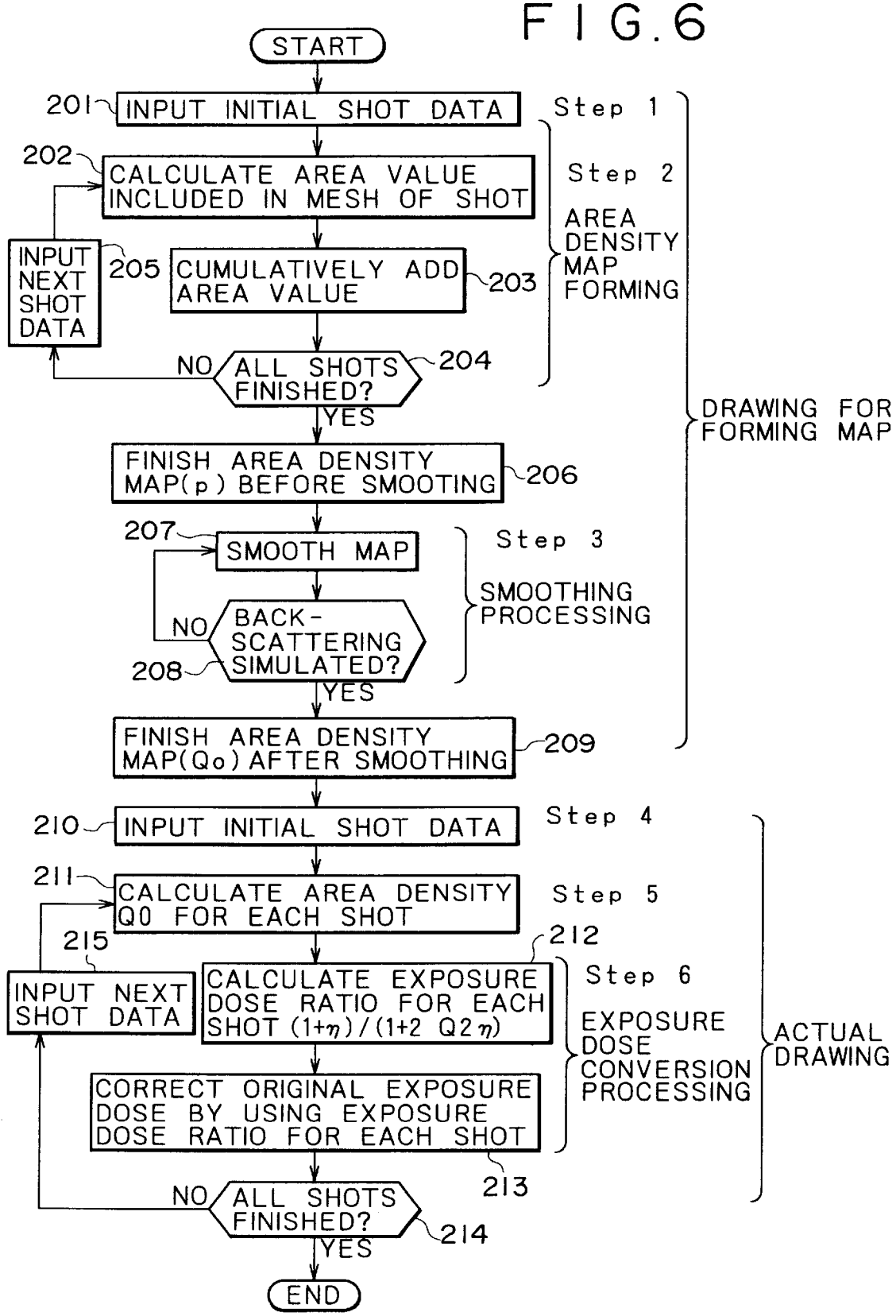
FIG. 6 is a flowchart showing a procedure of the constitution shown in FIG. 5.

Further, FIG. 4A is a result of simulation of the central portion line pattern having the width of 0.15 μm sandwiched by the two patterns having the large areas and FIG. 4B shows a result of simulation with respect to the edge portion line pattern having the width of 0.15 μm contiguous to one side face of the pattern having the large area in FIG. 3. Further, marks of black circles and black squares designate correction by the conventional method and marks of white circles and white squares designate correction by the present invention.

In the case of the central portion line pattern shown in FIG. 4A, at a portion where the density is abruptly changed from the high density side to the isolated side, while according to the correction by the conventional method, as shown by the black circle marks, "thinning" of about 15 nm is produced in the line width, according to the correction by the present invention, as shown by white circle marks, the line width is not changed dimensionally, the dimensional error with respect to the design value of 0.15 μm of the line width is confined within 5 nm and within 4% of dimension of other portion or the design value of 0.15 μm.

In the case of the edge portion line pattern shown in FIG. 4B, at a portion on the high density side, according to the correction by the conventional method, as shown by the black square marks, owing to influence of the large area pattern, "thinning" of about 15 nm in the line width is caused, however, according to the correction by the present invention, as shown by the white square marks, the line width is not so much changed and the dimensional error with respect to the design value 0.15 μm of the line width is confined to 6 nm or smaller and is equal to or smaller than 4% of 0.15 μm of the dimension of other portion or the design value of 0.15 μm.

In this way, according to the present invention, there can be achieved an excellent effect capable of reducing the error with respect to the design value of the line width of the pattern to be exposed more than the correction by the conventional method.

Further, the present invention can be realized without adding a special circuit or memory and accordingly, an enormous effect is provided also in shortening of a development time period and a reduction in the development cost or the product cost.

As has been described, the present invention achieves the effect capable of providing the electron beam drawing apparatus and the drawing method using electron beam capable of reducing the correction error of the proximity effect correction without adding special circuit or memory and capable of preventing thinning or thickening of a pattern arranged at a vicinity of an edge of a high density pattern from occurring.

What is claimed is:

1. Exposing method using an electron beam for irradiating a substrate with the electron beam and exposing exposure patterns on the substrate, comprising the steps of:
   (a) dividing the specimen into virtual meshes having a predetermined dimension;
   (b) calculating an area density of a drawing pattern for each virtual mesh;
   (c) calculating an area density map of a total of a drawing region of the specimen and storing the area density map in a memory;
   (d) calculating a modified area density by executing a correction for the area density in consideration of a back-scattering energy and a forward-scattering energy in a resist of the specimen caused by the electron beam to calculate a modified area density;
   (e) calculating a modified area density map of the total of the drawing region and storing the modified area density map in the memory; and
   (f) repeating the steps (d) and (e) at least twice to determine an exposure dose on the specimen.

2. Exposing method using an electron beam for irradiating a substrate with the electron beam and exposing exposure patterns on the substrate, comprising the steps of:
   (a) predicting a dimensional deformation caused due to a back-scattering energy and a forward-scattering energy in a resist of a specimen caused by irradiating the drawing pattern to be drawn on the specimen with the electron beam;
   (b) forming an exposure dose map by calculating an exposure dose of the electron beam used for correcting the dimensional deformation with respect to a total of a drawing region of the specimen; and
   (c) executing drawing based on the exposure dose map.

3. Exposing method using an electron beam for irradiating a substrate with the electron beam and exposing exposure patterns on the substrate, comprising the steps of:
   (a) dividing the specimen into virtual meshes having a predetermined dimension;
   (b) calculating an area density of the drawing pattern for each virtual mesh;
   (c) calculating a correction amount of the area density in consideration of a back-scattering energy and a forward-scattering energy in a resist of the specimen caused by the electron beam using a higher order approximation; and
   (d) determining an exposure dose of the drawing pattern.

4. Exposing method using an electron beam for irradiating a substrate with the electron beam and exposing exposure patterns on the substrate, comprising the steps of:
   (a) dividing the specimen into virtual meshes having a predetermined dimension;
   (b) calculating an area density of the drawing pattern for each virtual mesh to form an area density map of a total of a drawing region of the specimen;
   (c) calculating a first corrected area density by executing a smoothing correction for the area density in consideration of a back-scattering energy and a forward-scattering energy in a resist of the specimen caused by the electron beam to form a first corrected area density map of the total of the drawing region;
   (d) calculating a modified area density from the first corrected area density and the area density to form a modified area density map of the total of the drawing region;
   (e) calculating a second corrected area density by performing a smoothing correction for the modified area density in consideration of the back-scattering energy and the forward-scattering energy in the resist of the specimen caused by the electron beam to form a second corrected area density map of the total of the drawing region;
   (f) calculating an exposure area density from the second corrected area density and the first corrected area density to form an exposure area density map of the total of the drawing region; and
   (g) calculating an exposure dose for exposing the drawing pattern based on the exposure area density map.

5. Exposing method using an electron beam for irradiating a substrate with the electron beam and exposing exposure patterns on the substrate, comprising the steps of:

(a) calculating an area density of the drawing pattern used for correcting an exposure dose of the electron beam based on a difference from a desired dimension produced by irradiating the drawing pattern drawn on the specimen with the electron beam;

(b) calculating an area density map of a total of a drawing region of the specimen and storing the area density map in a memory; and (c) when a pattern contiguous to a line pattern having a linear shape among the drawing patterns drawn on the specimen stays in the middle for its length in a longitudinal direction of the line pattern, determining an exposure dose such that a rate of a change in a width dimension of the line pattern is equal to or smaller than 4% relative to a width dimension of the line pattern at other position before and after the position based on the area density map stored to the memory for drawing.

6. Electron beam exposure system for irradiating a substrate with an electron beam and exposing exposure patterns on the substrate, comprising:

an area density calculating unit for calculating an area density map of a total of a drawing region of a specimen by dividing the specimen into virtual meshes having a predetermined dimension and calculating an area density of a drawing pattern for each virtual mesh;

a memory for storing the area density map calculated by the area density calculating unit;

a modified area density calculating unit for repeating steps of calculating a modified area density by executing a correction for the area density in consideration of a back-scattering energy and a forward-scattering energy in a resist of the specimen caused by the electron beam, calculating a modified area density map of the total of the drawing region and storing the modified area density map in the memory by a plurality of times; and an exposure dose determining unit for determining an exposure dose to the specimen based on the modified area density map calculated by the modified area density calculating unit.

7. Electron beam exposure system for irradiating a substrate with an electron beam and exposing exposure patterns on the substrate, comprising:

an exposure map forming unit for predicting a dimensional deformation caused due to a back-scattering energy and a forward-scattering energy in a resist of the specimen caused by irradiating the drawing pattern to be drawn on the specimen with the electron beam and calculating an exposure dose of the electron beam used for correcting the dimensional deformation with respect to a total of a drawing region of the specimen to form an exposure dose map; and a drawing unit for executing drawing based on the exposure dose map prepared by the exposure dose map forming unit.

8. Electron beam exposure system for irradiating a substrate with an electron beam and exposing exposure patterns on the substrate, comprising:

an area density calculating unit for dividing the specimen into virtual meshes having a predetermined dimension and calculating an area density of the drawing pattern for each virtual mesh;

a correction amount calculating unit for calculating a correction amount for the area density in consideration of a back-scattering energy and a forward-scattering energy in a resist of the specimen caused by the electron beam using a higher order approximation; and an exposure dose determining unit for determining an exposure dose of the drawing pattern based on the correction amount calculated by the correction amount calculating unit.

9. Electron beam exposure system for irradiating a substrate with an electron beam and exposing exposure patterns on the substrate, comprising:

an area density calculating unit for dividing the specimen into virtual meshes having a predetermined dimension and calculating an area density of the drawing pattern for each virtual mesh to form an area density map of a total of a drawing region of the specimen;

a first corrected area density calculating unit for calculating a first corrected area density by executing a smoothing correction for the area density calculated by the area density calculating unit in consideration of a back-scattering energy and a forward-scattering energy in a resist of the specimen caused by the electron beam to form a first corrected area density map of the total of the drawing region;

a modified area density calculating unit for calculating a modified area density from the first corrected area density calculated by the first corrected area density calculating unit and the area density calculated by the area density calculating unit to form a modified area density map of the total of the drawing region;

a second corrected area density calculating unit for calculating a second corrected area density by executing a smoothing correction for the modified area density calculated by the modified area density calculating unit in consideration of the back-scattering energy and the forward-scattering energy in the resist of the specimen caused by the electron beam to form a second corrected area density map of the total of the drawing region;

an exposure area density calculating unit for calculating an exposure area density from the second corrected area density calculated by the second corrected area density calculating unit and the first corrected area density calculated by the first corrected area density calculating unit to form an exposure area density map of the total of the drawing region; and an exposure dose determining unit for determining an exposure dose of the drawing pattern based on the exposure area density prepared by the exposure area density calculating unit.

10. Electron beam exposure system for irradiating a substrate with an electron beam and exposing exposure patterns on the substrate, comprising:

an area density calculating unit for calculating an area density of the drawing pattern used for correcting an exposure dose of the electron beam based on a difference from a desired dimension produced by irradiating the drawing pattern to be drawn on the specimen with the electron beam to calculate an area density map of a total of a drawing region of the specimen;

a memory for storing the area density map calculated by the area density calculating unit; and a drawing unit in which when a pattern contiguous to a line pattern having a linear shape among the drawing patterns to be drawn on the specimen stays in the middle for its length in a longitudinal direction of the line pattern, determining an exposure dose such that a rate of a change in a width dimension of the line pattern is equal to or smaller than 4% relative to a width dimension of the line pattern at other position before and after the position based on the area density map stored to the memory for drawing.

11. Electron beam exposure system for irradiating a substrate with an electron beam and exposing exposure patterns on the substrate, comprising:

a pattern dividing unit for dividing a drawing pattern into electron beam drawing shots;

a mesh assuming unit for assuming a virtual mesh for secting an electron beam drawing region of the specimen;

an area density map forming unit for calculating an area density included in the electron beam drawing shot or the virtual mesh of the drawing pattern included in the virtual mesh based on a positional relationship between the virtual mesh assumed by the mesh assuming unit and the electron beam drawing shot divided by the pattern dividing unit to form an area density map of the electron beam drawing region; and an exposure dose calculating unit for calculating an exposure dose in drawing a drawing pattern by irradiating the specimen with the electron beam based on the area density map calculated by the area density map forming unit;

wherein the area density map forming unit forms a plurality of area density maps.

12. Electron beam exposure system for irradiating a substrate with an electron beam and exposing exposure patterns on the substrate, comprising:

a pattern dividing unit for dividing the drawing pattern into electron beam drawing shots;

a mesh assuming unit for assuming a virtual mesh for secting an electron beam drawing region of the specimen;

an area density map forming unit for calculating an area density of the electron beam drawing shot or the drawing pattern included in the virtual mesh based on a positional relationship between the virtual mesh assumed by the mesh assuming unit and the electron beam drawing shot divided by the pattern dividing unit to form an area density map of the electron beam drawing region; and an exposure dose calculating unit for calculating an exposure dose in drawing a drawing pattern by irradiating the specimen with the electron beam based on the area density map calculated by the area density map forming unit;

where in the area density map forming unit processes data on a plurality of area density maps in parallel.

13. Exposing method using an electron beam for irradiating a substrate with the electron beam and exposing exposure patterns on the substrate, comprising the steps of:

(a) dividing the specimen into virtual meshes having a predetermined dimension;

(b) calculating an area density $p(x)$ of the drawing pattern for each virtual mesh to form an area density map of a total of a drawing region of the specimen;

(c) calculating a first corrected area density $Q0(x)$ in Equation (1) by executing a smoothing correction for the area density $p(x)$ in consideration of a back-scattering energy and a forward-scattering energy in a resist of the specimen caused by the electron beam at a coordinate x' by using Gaussian function $\Phi(x-x')$;

$$Q0(x)=\int \Phi(x-x')p(x')dx' \quad (1)$$

(d) forming a first corrected area density map of a total of the drawing region from the first corrected area density $Q0(x)$;

(e) calculating a modified area density $p1(x)$ from the first corrected area density $Q0(x)$ and the area density $p(x)$ in Equation (2) by using a reflection coefficient $\eta$ constituting a ratio of a back-scattering energy to a forward-scattering energy in the resist of the specimen caused by the electron beam;

$$p1(x)=p(x)/\{1+2\eta Q0(x)\} \quad (2)$$

(f) calculating a second corrected area density $Q1(x)$ in Equation (3) by forming a modified area density map of the total of the drawing region from the modified area density $p1(x)$ and executing a smoothing correction for the modified area density map in consideration of the back-scattering energy and the forward-scattering energy in the resist of the specimen caused by the electron beam on the modified area density $p1(x)$;

$$Q1(x)=\int \Phi(x-x')p1(x')dx' \quad (3)$$

(g) forming a second corrected area density map of the total of the drawing region from the second corrected area density $Q1(x)$;

(h) calculating an exposure area density $Q2(x)$ in Equation (4) from the second corrected area density $Q1(x)$ and the first corrected area density $Q0(x)$;

$$Q2(x)=\{1+2\eta Q0(x)\}\cdot Q1(x) \quad (4)$$

(i) forming an exposure area density map of the total of the drawing region from the exposure area density $Q2(x)$;

(j) calculating an exposure dose $I(x)$ in Equation (5) from an exposure dose $I0(x)$ with respect to a drawing pattern having the area density $p(x)$ of 50% and the exposure area density $Q2(x)$;

$$I(x)=I0(x)\cdot(1+\eta)/(1+2\eta Q2(x)) \quad (5)$$

(k) forming an exposure dose map the total of the drawing region from the exposure dose $I(x)$; and (l) determining the exposure dose for exposing the drawing pattern based on the exposure dose map.

* * * * *